(12) United States Patent
McConnelee et al.

(10) Patent No.: US 8,334,593 B2
(45) Date of Patent: Dec. 18, 2012

(54) SEMICONDUCTOR DEVICE PACKAGE

(75) Inventors: Paul Alan McConnelee, Albany, NY (US); Arun Virupaksha Gowda, Rexford, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 13/349,598

(22) Filed: Jan. 13, 2012

(65) Prior Publication Data
US 2012/0161325 A1   Jun. 28, 2012

Related U.S. Application Data

(62) Division of application No. 12/975,466, filed on Dec. 22, 2010, now Pat. No. 8,114,712.

(51) Int. Cl.
*H01L 23/48* (2006.01)
*H01L 23/52* (2006.01)
*H01L 29/40* (2006.01)

(52) U.S. Cl. ........ 257/734; 257/678; 257/701; 257/707; 257/723; 257/728; 257/774; 257/E23.001; 257/E33.056

(58) Field of Classification Search ........... 257/678, 257/701, 707, 723, 728, 734, 774, E23.001, 257/E33.056
See application file for complete search history.

(56) References Cited

U.S. PATENT DOCUMENTS

| 4,764,485 | A | 8/1988 | Loughran et al. |
| 5,637,922 | A | 6/1997 | Fillion et al. |
| 5,841,193 | A * | 11/1998 | Eichelberger ............ 257/723 |
| 6,159,772 | A | 12/2000 | Vinciarelli et al. |
| 6,232,151 | B1 | 5/2001 | Ozmat et al. |
| 6,242,282 | B1 | 6/2001 | Fillion et al. |
| 6,306,680 | B1 | 10/2001 | Fillion et al. |
| 6,396,153 | B2 | 5/2002 | Fillion et al. |
| 6,581,280 | B2 * | 6/2003 | Curcio et al. ............ 29/832 |
| 7,262,444 | B2 | 8/2007 | Fillion et al. |
| 7,626,249 | B2 | 12/2009 | Quinones et al. |
| 7,629,892 | B1 * | 12/2009 | DeMott ............ 340/686.1 |
| 2001/0035570 | A1 * | 11/2001 | Iijima et al. ............ 257/678 |
| 2004/0150080 | A1 * | 8/2004 | Lee et al. ............ 257/678 |
| 2007/0085212 | A1 * | 4/2007 | Mao et al. ............ 257/758 |
| 2007/0090464 | A1 | 4/2007 | Delgado et al. |

(Continued)

OTHER PUBLICATIONS

Fisher et al.; "High Frequency, Low Cost, Power Packaging Using Thin Film Power Overlay Technology", IEEE, Applied Power Electronics Conference and Exposition, 1995. APEC '95. Conference Proceedings 1995., Tenth Annual, Mar. 1995, vol. 1, pp. 12-17.

Butler et al.; "An Embedded Overlay Concept for Microsystems Packaging"; Advanced Packaging, IEEE, Nov. 2000, vol. 23, Issue 4, pp. 617-622.

(Continued)

*Primary Examiner* — Asok Sarkar
(74) *Attorney, Agent, or Firm* — Andrew J. Caruso

(57) ABSTRACT

A semiconductor device package is provided. The semiconductor device package includes a laminate comprising a first metal layer disposed on a dielectric film; a plurality of vias extending through the laminate according to a predetermined pattern; one or more semiconductor devices attached to the dielectric film such that the semiconductor device contacts one or more vias; a patterned interconnect layer disposed on dielectric film, said patterned interconnect layer comprising one or more patterned regions of the first metal layer and an electrically conductive layer, wherein a portion of the patterned interconnect layer extends through one or more vias to form an electrical contact with the semiconductor device. The patterned interconnect layer comprises a top interconnect region and a via interconnect region, wherein the package interconnect region has a thickness greater than a thickness of the via interconnect region.

14 Claims, 7 Drawing Sheets

U.S. PATENT DOCUMENTS

| | | | |
|---|---|---|---|
| 2007/0202655 A1* | 8/2007 | Min | 438/381 |
| 2008/0087986 A1* | 4/2008 | Tanikella | 257/643 |
| 2008/0190748 A1 | 8/2008 | Arthur et al. | |
| 2010/0230800 A1 | 9/2010 | Beaupre et al. | |

OTHER PUBLICATIONS

Ozmat et al; "A New Power Module Packaging Technology for Enhanced Thermal Performance", Thermal and Thermomechanical Phenomena in Electronic Systems, 2000, vol. 2, 10 Pages.

Ozmat et al; "An advanced approach to power module packaging"; Downloaded from the Internet<http://www.metalfoamheatexchangers.com/Images/Publications/iwipp.pdf> on Jan. 20, 2011; 2000, 4 Pages.

Xiao et al., "Flip-Chip Flex-Circuit Packaging for Power Electronics", Proceedings of the 13th International Symposium on Power Semiconductor Devices and ICs 2001, Jun. 2001, ISPSD 01, pp. 55-58.

* cited by examiner

SEMICONDUCTOR DEVICE PACKAGE

CROSS-REFERENCE TO RELATED APPLICATIONS

This application is a divisional of U.S. patent application Ser. No. 12/975,466, filed 22 Dec. 2010, which is herein incorporated by reference.

BACKGROUND

The present invention relates generally to electronic packaging technology and, more particularly, to electronic packaging technology applicable to power semiconductor devices.

Advanced semiconductor device technologies, such as, Integrated Gate Bipolar Transistor (IGBT), Metal Oxide Semiconductor Field effect Transistor (MOSFET), MOS Controlled Thyristor (MCT) offer improve thermal and electrical performance for a broad range of applications in a wide range of power levels. However, to fully utilize the capabilities of such devices there is a need to provide improved packaging designs.

Typical semiconductor module designs employ wire bonds for connecting semiconductor devices to power busses and control terminals. The semiconductor devices are commonly soldered onto a metalized insulating ceramic substrate and subsequently bonded to a heat spreader. Typically, an injection molded polymer shell covers the module, exposing only the input/output and control terminals and the heat spreader. The heat spreader is attached to a heat sink and thermal contact between the heat spreader and the heat sink is achieved through a thermal paste or a thermally conductive polymer. Disadvantages of wire-bond based semiconductor module designs include relatively high parasitic impedance, high volume and weight, high thermal resistance, and limited reliability primarily due to the wire bonds.

Power overlay (POL) technology eliminates use of wire bonds and offers significant advantages over the wire-bond based packaging of power modules, for example, higher packaging density, lower package parisitics, enhanced reliability, lower weight, smaller size, and higher efficiency. A typical power overlay fabrication process involves use of a dielectric film stretched on a frame. An adhesive layer is applied to the dielectric film, on which vias are formed by laser ablation, followed by attachment of the semiconductor devices to the dielectric film. This is followed by metallization and formation of circuits on the film by electroplating a thick layer of copper on the dielectric film and into the vias. The resulting package is then attached to a substrate. In some instances, "feed-through" structures or "shims", which are used to connect the metalized layer with the substrate electrically may be separately attached to the dielectric film. Accordingly, in POL technology, power and control circuits to devices are achieved through the metalized vias, thus obviating the need for bond wires.

However, the current POL fabrication process may still pose economic and technical challenges because of the number of steps and the time involved for each step. For example, the metallization step typically involves electroplating for hours to achieve the desired copper thickness for current handling, which significantly increases the cost of the POL process. Further, the use of a frame reduces the available area for packaging and also adds processing steps to the POL fabrication process. The use of separate copper shims may further increase the cost of the fabrication step and may pose technical challenges, such as, lower adhesion.

Thus, there is a need to streamline POL fabrication processes in order to provide cost-effective semiconductor device packaging fabrication processes that overcome one or more disadvantages associated with current POL processes.

BRIEF DESCRIPTION OF THE INVENTION

Embodiments of the present invention are provided to meet these and other needs. One embodiment is a method of fabricating a semiconductor device package. The method includes providing a laminate comprising a dielectric film disposed on a first metal layer, said laminate having a dielectric film outer surface and a first metal layer outer surface; forming a plurality of vias extending through the laminate according to a predetermined pattern; attaching one or more semiconductor devices to the dielectric film outer surface such that the semiconductor device contacts one or more vias after attachment; disposing an electrically conductive layer on the first metal layer outer surface and on an inner surface of the plurality of vias to form an interconnect layer comprising the first metal layer and the electrically conductive layer; and patterning the interconnect layer according to a predetermined circuit configuration to form a patterned interconnect layer, wherein a portion of the patterned interconnect layer extends through one or more vias to form an electrical contact with the semiconductor device.

Another embodiment is a method of fabricating a semiconductor device package. The method includes providing a laminate comprising a dielectric film interposed between a first metal layer and a second metal layer, said laminate having a first metal layer outer surface and a second metal layer outer surface; patterning the second metal layer according to a predetermined pattern to form a patterned second metal layer; forming a plurality of vias extending through the laminate according to a predetermined pattern; attaching one or more semiconductor devices to the second metal layer outer surface of a portion of the patterned second metal layer; disposing an electrically conductive layer on the first metal layer outer surface and on an inner surface of one or more vias to form an interconnect layer comprising the first metal layer and the electrically conductive layer; and patterning the interconnect layer according to a predetermined circuit configuration to form a patterned interconnect layer, wherein a portion of the patterned interconnect layer extends through one or more vias to form an electrical contact with the semiconductor device.

Yet another embodiment is a semiconductor device package. The semiconductor device package includes a laminate comprising a first metal layer disposed on a dielectric film; a plurality of vias extending through the laminate according to a predetermined pattern; one or more semiconductor devices attached to the dielectric film such that the semiconductor device contacts one or more vias; a patterned interconnect layer disposed on dielectric film, said patterned interconnect layer comprising one or more patterned regions of the first metal layer and an electrically conductive layer, wherein a portion of the patterned interconnect layer extends through one or more vias to form an electrical contact with the semiconductor device. The patterned interconnect layer comprises a top interconnect region and a via interconnect region, wherein the package interconnect region has a thickness greater than a thickness of the via interconnect region.

DRAWINGS

These and other features, aspects, and advantages of the present invention will become better understood when the following detailed description is read with reference to the accompanying drawings, wherein.

DETAILED DESCRIPTION

Figure 1:
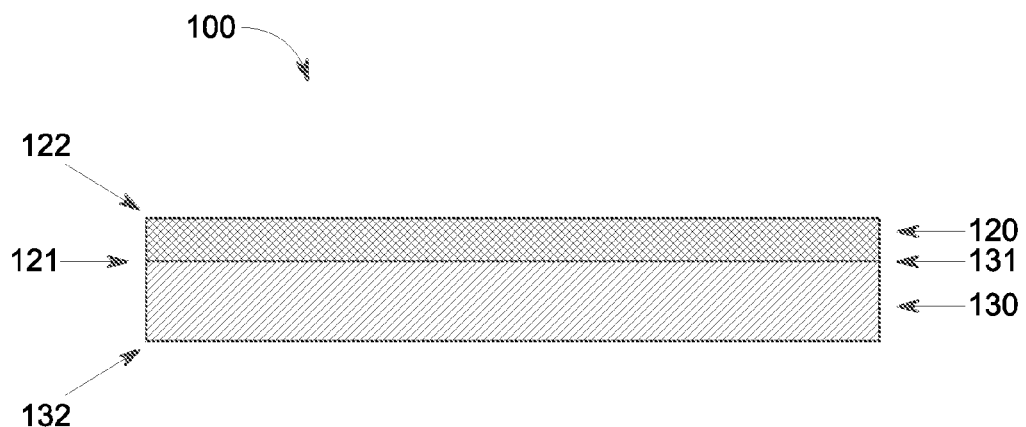
FIG. 1 is a sectional side view of a fabrication process step according to one embodiment of the invention.

As discussed in detail below, some of the embodiments of the invention provide a method for fabricating a semiconductor device package using a pre-metallized dielectric film.

Approximating language, as used herein throughout the specification and claims, may be applied to modify any quantitative representation that could permissibly vary without resulting in a change in the basic function to which it is related. Accordingly, a value modified by a term or terms, such as "about", is not limited to the precise value specified. In some instances, the approximating language may correspond to the precision of an instrument for measuring the value.

In the following specification and the claims, the singular forms "a", "an" and "the" include plural referents unless the context clearly dictates otherwise.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable, or suitable. For example, in some circumstances, an event or capacity can be expected, while in other circumstances the event or capacity cannot occur—this distinction is captured by the terms "may" and "may be".

An exemplary semiconductor device package is described in terms of the following process steps with reference to the drawing figures. Any dimensional and component values given herein are exemplary only for purposes of illustration and are not intended to limit the scope of the invention described herein. FIGS. 1-13 are sectional side views of the steps of fabrication process according to some embodiments of the invention. As used herein, the terms "disposed on" or "attached to" refer to layers or devices disposed or attached directly in contact with each other or indirectly by having intervening layers therebetween.

As illustrated in FIG. 1, the method includes providing a laminate 100 comprising a dielectric film 120 disposed on a first metal layer 130. As illustrated in FIG. 1, the laminate 100 further includes a dielectric film outer surface 122 and a first metal layer outer surface 132. The dielectric film 120 further includes an inner surface 121 and the first metal layer includes an inner surface 131, such that the first metal layer inner surface 131 is disposed adjacent to the dielectric layer inner surface 121. While laminate 100 is illustrated as having a rectangular shape, laminate 100 may have any desired shape or size which is suitable for forming the structures of the present application.

In one embodiment, the dielectric film 120 includes an organic dielectric material chosen to have particular thermal, structural and electrical properties, suitable for use in semiconductor packaging structures. In some embodiments, the dielectric film 120 has a low modulus (high compliance), low x, y and z-axis coefficient of thermal expansion (CTE), and a high glass transition temperature ($T_g$) or melting temperature ($T_m$), thus improving the thermal and structural reliability of the resulting semiconductor device package. In one embodiment, the dielectric film 120 includes an electrically insulative polymer stable for continuous use at temperatures above 150° C. Non-limiting examples of suitable materials include polyimides, such as, KAPTON (a trademark of E.I. DuPont de Nemours and Co.); polyetherimides, such as, ULTEM (a trademark of General Electric Company); polyquinolines; polyquinoxalines; polyetherkeytones; and bismaleimide-triazine resins. In one particular embodiment, the dielectric film 120 includes a polyimide, such as, KAPTON.

In one embodiment, the first metal layer 130 includes copper and the laminate 100 is provided by disposing a first metal layer 130 on the dielectric layer 120. In some embodiments, the first metal layer 130 may be directly attached to the dielectric film 120, that is, no adhesive layer may be present between the dielectric film 120 and the first metal layer 130. In some other embodiments, an adhesive layer (not shown) is interposed between the dielectric film 120 and the first metal layer 130. In some embodiments, the first metal layer may be laminated on the dielectric film using a roll-on manufacturing method.

In one embodiment, the dielectric film 120 has a thickness in a range from about 1 micron to about 1000 microns. In another embodiment, the dielectric film 120 has a thickness in a range from about 5 microns to about 200 microns. In one embodiment, the first metal layer has a thickness in a range from about 10 microns to about 200 microns. In another embodiment, the first metal layer has a thickness in a range from about 25 microns to about 150 microns. In a particular embodiment, the first metal layer has a thickness in a range from about 50 microns to about 125 microns. As described in detail below, by providing a laminate 100 comprising a first metal layer 130 having a desired thickness, the time taken for subsequent deposition of electrically conductive layer and metallization of vias may be accordingly reduced.

As noted earlier, the laminate 100 does not include a frame and accordingly the method does not involve the step of framing the dielectric film 120. In some embodiments, the first metal layer 130 provides the structural support for the dielectric film 120 and dimensional stability to the semiconductor device package manufactured therefrom. Further, the first metal layer 130 may provide for ease of handling and ease of transport in the absence of a carrier frame that is typically used for power overlay fabrication process. A frame-less dielectric film advantageously provides for increased usable area for attaching the semiconductor devices, and accordingly a large number of semiconductor devices may be attached using the methods of the present invention.

Figure 2:
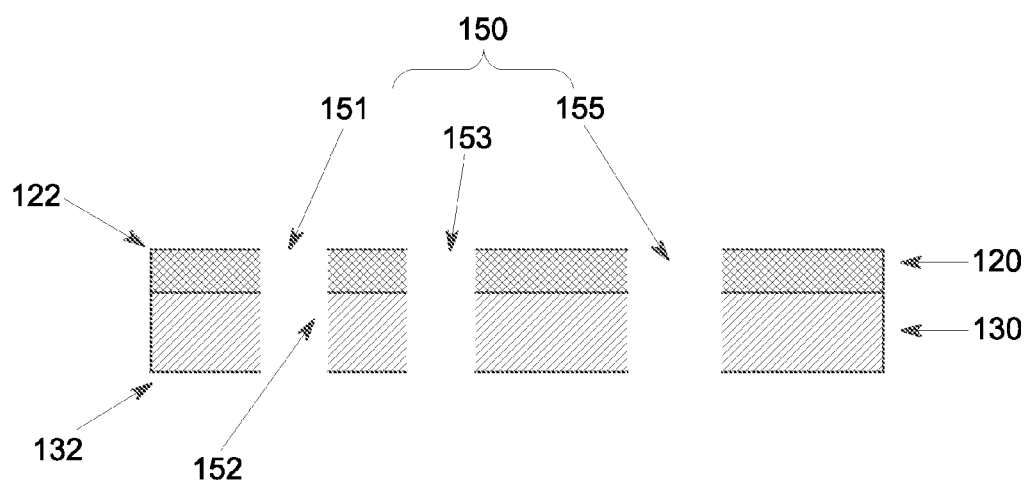
FIG. 2 is a sectional side view of a fabrication process step according to one embodiment of the invention.

As illustrated in FIG. 2, the method further includes forming a plurality of vias 150 extending through the laminate 100 according to a predetermined pattern. Multiple vias, such as representative vias 150, may be formed through the laminate 100, by a standard mechanical punch process, water set punch process, chemical etch process, plasma etching, reactive ion etching, or laser processing for example. In one embodiment, the vias 150 are formed through the laminate by laser ablation. The via pattern is determined by one or more of number of devices to be attached, the number of device contact pads, size of device contact pads, and the desired circuit configuration. As shown in FIG. 2, the plurality of vias 150 further include a via inner surface 152.

Figure 4:
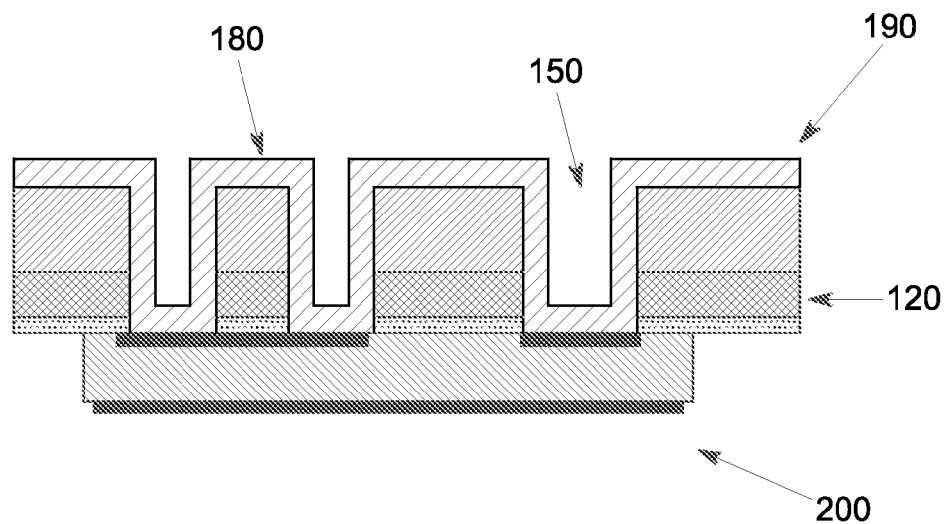
FIG. 4 is a sectional side view of a fabrication process step according to one embodiment of the invention.

In one embodiment, the vias 150 have a circular shape with vertical sidewalls, as illustrated in FIG. 2. The shape of vias 150 is not limited, however, and the vias may include any suitable shape. For example, vias 150 may have an oval shape or a square shape with rounded corners, or another more complex shape. In another embodiment, vias 150 have tapered sidewalls. The size and number of vias may depend in part upon the size of contact pads 210 and 220 and the electrical current requirements of device 200. For example, as illustrated in FIG. 4, a conductive layer 180 contacts contact pad 210 through two vias and the contact pad 220 through one via, in order to meet the desired electrical current requirements for device 200, in one exemplary embodiment. In another embodiment, three or more vias 150 may contact the contact pad 210. In an alternative embodiment, fewer vias having larger openings may be employed to meet the same desired current requirements. For example, a single large via could replace the plurality of vias in contact with contact pad 210 in the FIG. 4 embodiment. In one embodiment, the plurality of vias 150 have a diameter in a range from about 25 microns to about 10000 microns. In another embodiment, the plurality of vias 150 have a diameter in a range greater than about 10000 microns. In yet another embodiment, the plurality of vias 150 have a diameter in a range from about 2000 microns to about 40000 microns. In one embodiment, the first metal layer 130 may improve the dimensional stability of the laminate 100, allowing tighter spacing for vias 150. Increased via 150 density may advantageously reduce resistive losses and current crowding. Multiple connections formed through the vias to a single contact pad provide an electrical connection, which may be superior to a single wire bond.

Figure 3:
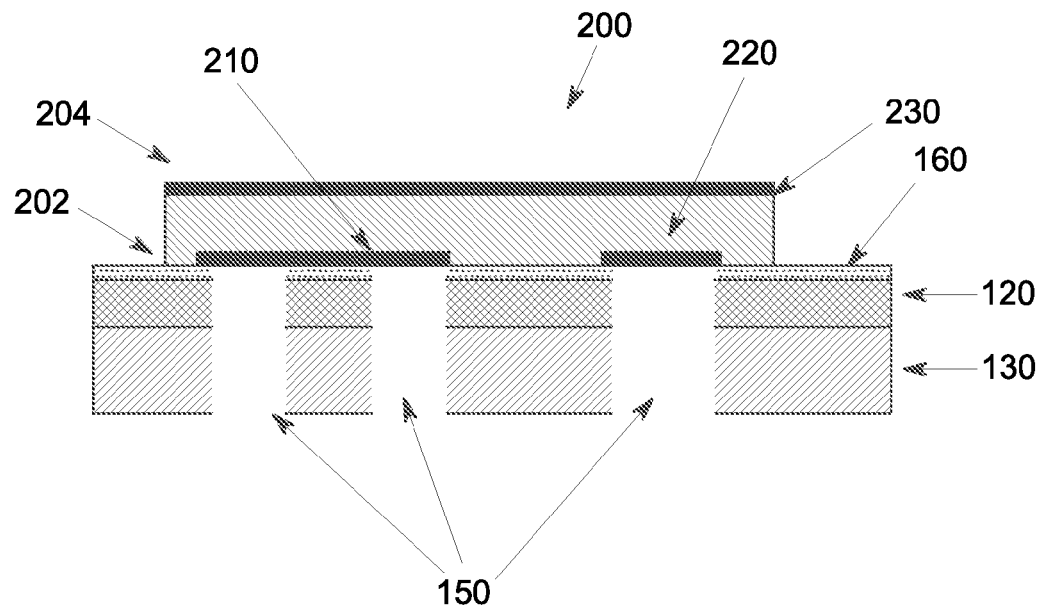
FIG. 3 is a sectional side view of a fabrication process step according to one embodiment of the invention.

The method further includes interposing an adhesive layer 160 between the dielectric layer 120 and the device 200. In one embodiment, the method includes disposing an adhesive layer 160 on the dielectric outer surface 122 as shown in FIG. 3. The adhesive layer 160 may be applied before or after the via formation. In some embodiments, a protective release layer (not shown) may be applied over the adhesive layer 160 to keep the adhesive layer 160 clean during the via formation process. Adhesion layer 160 may be applied to the dielectric outer surface 122 by any suitable method. For example, the adhesion layer 160 may be applied by spin coating, meniscus coating, spray coating, vacuum deposition, or lamination techniques. In the embodiment illustrated in FIG. 3, adhesion layer 160 is applied to dielectric film outer surface 122 after vias 150 are formed. In an alternative embodiment, adhesion layer 160 is applied to the dielectric film outer surface 122 before vias 150 are formed. Vias 150 are then formed through both dielectric film 120 and adhesion layer 160 using any suitable technique, such as the mechanical drilling, laser processing, plasma etching, reaction ion etching, or chemical etching techniques mentioned above.

In another embodiment, the method includes disposing an adhesive layer 160 on the active surface 202 of the device 200. The adhesive layer 160 may be applied before or after the via formation. In some embodiments, a protective release layer (not shown) may be applied over the adhesive layer 160 to keep the adhesive layer 160 clean during the via formation process. Adhesion layer 160 may be applied to the active surface 202 by any suitable method. For example, the adhesion layer 160 may be applied by spin coating, meniscus coating, spray coating, vacuum deposition, or lamination techniques.

The adhesive layer 160 may include one or more of a thermoset polymer or a thermoplastic polymer. Suitable non-limiting examples for adhesive layer 160 include acrylic, an epoxy, and a polyetherimide. In one embodiment, a low temperature cure thermoset may be used as an adhesive to minimize high temperature processing. In one embodiment, the adhesive layer has a thickness in a range from about 1 micron to about 100 microns. In one embodiment, a suitable material for adhesive layer 160 includes a polyetherimide having a thickness in a range from about 10 microns to about 25 microns.

As shown in FIG. 3, the method further includes attaching one or more semiconductor devices 200 to the dielectric film outer surface 122, such that the semiconductor device contacts one or more vias 150 after attachment. In a particular embodiment, the semiconductor device 200 is representative of a power device. In one embodiment, the semiconductor device 200 is representative of power semiconductor devices of various types, such as but not limited to power MOSFETs (metal oxide field effect transistors) and IGBTs (insulated gate bipolar transistors), which are employed in power switching applications. In another embodiment, the semiconductor device 200 is a diode. A single semiconductor device 200 is provided by way of example only. However, in the actual power overlay fabrication process a plurality of semiconductor devices may be attached to the dielectric film outer surface 122. In an exemplary embodiment, prior to any packaging or interconnection, these devices 200 generally are in the form of a semiconductor chip having an active surface 202 and an opposite surface 204. Active surface 202 is patterned and has metallized I/O (input/output) pads 210 and 220 including, in the case of a power semiconductor device 220, at least two terminals, namely, a device main terminal such as a source terminal represented by contact pad 210, and a control terminal such as a gate terminal, represented by contact pad 220. In some embodiments, in order to provide low impedance connections, there is either a large main terminal 210 on active surface 202, or there are multiple main terminals 210 (not shown), all to be connected in parallel, and additionally one or more control terminals 220 (not shown), likewise to be connected in parallel. The uniform opposite surface 204 includes another device main terminal 230, such as a drain terminal.

In one embodiment, after disposing the adhesion layer 160 on the dielectric outer surface 122 or the active surface 202 of device 200, active surface 202 of device 200 is brought into contact with adhesion layer 160 so that vias 150 are aligned with contact pads 210 and 220, as shown in FIG. 3. In one exemplary embodiment, device 200 is positioned onto adhesion layer 160 using a pick and place machine. Device 200 is then bonded to the dielectric film 120. In one embodiment, adhesion layer 160 is a thermoplastic, and bonding is accomplished by raising the temperature until sufficient flow has occurred in the thermoplastic to allow bonding to occur. In another embodiment, adhesion layer 160 is a thermoset and bonding is accomplished by raising the temperature of the adhesion layer until cross-linking has occurred. In one embodiment, device 200 is bonded to the dielectric film 160 using a thermal curing cycle and, if required, a vacuum to facilitate removal of entrapped air and out gassing from adhesive 160. Alternative curing options include a microwave cure and an ultraviolet light cure, for example.

In one embodiment, the method further includes disposing an electrically conductive layer 180 on the first metal layer outer surface 132 as shown in FIG. 4. The method further includes disposing the electrically conductive layer 180 on an inner surface 152 of the plurality of vias 150. As illustrated in FIG. 4, the electrically conductive layer 180 and the first metal layer 130 form the interconnect layer 190 on the dielectric film outer surface 122. The interconnect layer 190 further extends through the vias and comprises of the electrically conductive layer 180 in the vias 150, as shown in FIG. 4.

Electrically conductive layer 180 may include any conductive material suitable for use in semiconductor device interconnects. In one embodiment, electrically conductive layer 180 includes refractory metals, noble metals, or combinations thereof. Non-limiting examples of suitable metals and metal alloys include tungsten, molybdenum, titanium/tungsten, gold, platinum, palladium, gold/indium, and gold/germanium. In another embodiment, copper, aluminum, or alloys of copper or aluminum may be employed as the electrically conductive layer 180. The material employed for the electrically conductive layer 180 may be chosen to withstand the temperatures at which the semiconductor device 200 is expected to operate. In one embodiment, the electrically conductive layer 180 includes the same material as the first metal layer 130. In a particular embodiment, the electrically conductive layer 180 includes copper.

In one embodiment, the electrically conductive layer 180 may be disposed on the first metal layer outer surface 122 and an inner surface of the vias 152 by sputtering, chemical vapor deposition, electroplating, electroless plating, or any other suitable methods. In a particular embodiment, the electrically conductive layer 180 is disposed by electroplating. In some embodiments, the method may further include disposing one or more additional layers before disposing the electrically conductive layer, such as for example, a seed layer (not shown). In one embodiment, the seed layer includes a barrier metal such as Ti, Cr or Ni, or in alternative embodiments, the seed layer includes a non-barrier metal such as Cu. Typically, a seed layer is desirable to obtain good adhesion between the electrically conductive layer 180 and the dielectric film 120. In some embodiments, the methods of the present invention obviate the need for deposition of a separate seed layer, as the first metal layer 130 provides the required surface characteristics for deposition of the electrically conductive layer 180 and also provides for improved adhesion between the electrically conductive layer 180 and the dielectric film 120.

The thickness of the electrically conductive layer 180 may depend in part upon the amount of current that will pass through the interconnect layer, the width of the patterned regions in the patterned interconnect layer 192, and the thickness of the first metal layer 130 already present on the dielectric film. In one embodiment, the electrically conductive layer 180 has a thickness in a range from about 10 microns to about 100 microns. In a particular embodiment, the electrically conductive layer has a thickness in a range from about 25 microns to about 50 microns. As noted earlier, lower thickness of the electrically conductive layer 180 means lesser time required for deposition, for example, plating of the electrically conductive layer 180, and thus reduced cost. In one embodiment, the electrically conductive layer 180 is deposited to a thickness such that the thickness of the resulting interconnect layer 190 is capable of carrying the relatively high currents typical for semiconductor device operation with relatively low resistive losses. As noted earlier, methods of the present invention advantageously allow for formation of a thick interconnect layer on the dielectric film and at the same reduce the time of manufacturing and associated cost. For example, a typical electroplating process for depositing a 125 microns thick interconnect layer may require 5-6 hours of electroplating time. In an exemplary embodiment of the present invention, a 25 microns thick electrically conductive layer may be deposited on a first metal layer having a thickness of 100 micron, which may advantageously reduce the manufacturing time by one-fifth.

Figure 5:
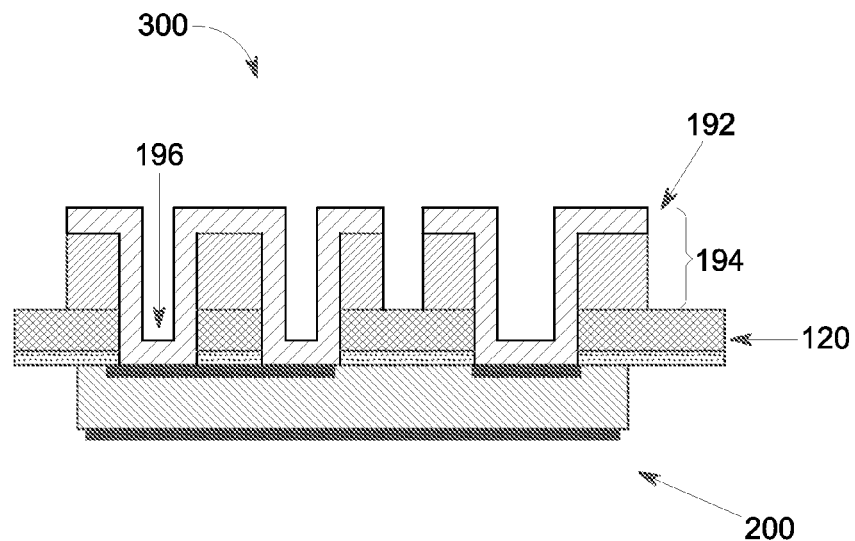
FIG. 5 is a sectional side view of a fabrication process step according to one embodiment of the invention.
Figure 6:
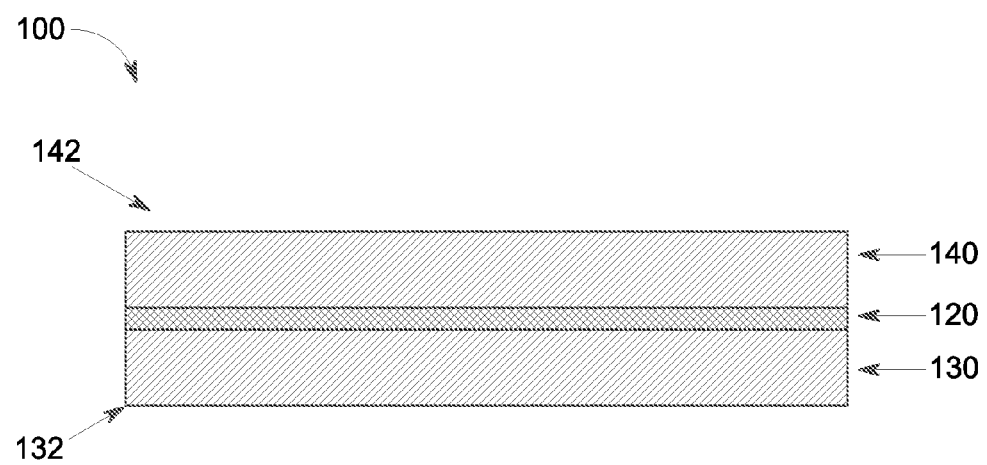
FIG. 6 is a sectional side view of a fabrication process step according to one embodiment of the invention.

The method further includes patterning the interconnect layer 190 according to a predetermined circuit configuration to form a patterned interconnect layer 192, wherein a portion of the patterned interconnect layer 192 extends through one or more vias 150 to form an electrical contact with the semiconductor device 200, as illustrated in FIG. 5. FIG. 5 illustrates a cross-sectional view of device 200 attached to dielectric film 120 after interconnect layer 190 is patterned. Interconnect layer 190 is patterned by selectively removing portions of the interconnect layer 190 to form patterned interconnect layer 192 comprised of packaging structure interconnects. As shown in FIG. 5, the patterned interconnect layer 192 includes a top interconnect region 194 and a via interconnect region 194. The top interconnect region 194 includes patterned portions of the first electrically conductive layer 180 and the first metal layer 130, and is formed adjacent to the dielectric film outer surface 122. The patterned interconnect layer 192 further includes a via interconnect region 196 formed in the plurality of vias 150. A first portion of the via interconnect region 196 is disposed adjacent to the sidewalls of the vias 150 and a second portion is disposed adjacent to one or more contact pads 210/220 of the semiconductor device 200. The via interconnect region 196 comprises of the electrically conductive layer 180.

As illustrated in FIG. 5, the top interconnect region 194 has a thickness greater than a thickness of the via interconnect region 196. In one embodiment, the via interconnect region 196 has a thickness in a range from about 5 microns to about 125 microns. In one embodiment, the via interconnect region 196 has a thickness in a range from about 25 microns to about 50 microns. In one embodiment, the top interconnect region 194 has a thickness in a range from about 25 microns to about 200 microns. In another embodiment, the top interconnect region 194 has a thickness in a range from about 75 microns to about 150 microns.

The top interconnect region 194 and the via interconnect region 196 may provide low resistance and low inductance interconnections. In one embodiment, the interconnect region comprising the top interconnect region 192 and the via interconnect region 194 in electrical contact with contact pad 210 may serve as a package main terminal contact, and may have sufficient current carrying capability for the device 200. Similarly, the interconnect region comprising the top interconnect region 192 and the via interconnect region 194 in electrical contact with contact pad 220 may serve as a package gate terminal contact In one embodiment, the interconnect layer 190 is patterned by subtractive etching method, semi-additive processing technique, or lithography, such as for example, adaptive lithography. For example, in one embodiment a photo mask material may be applied over the surface of the interconnect layer 190, followed by photo developing the photo mask material into the desired interconnect pattern, and then etching the exposed portions of interconnect layer 190 using a standard wet etch bath. In an alternative embodiment, a thin metal seed layer may be formed on metal layer 130. A photo mask material is applied over the surface of the thin metal seed layer, followed by photo developing the photo mask material so that the thin metal seed layer is exposed where the desired interconnect pattern is to be formed. An electroplating process is then employed to selectively deposit additional metal on the exposed seed layer to form a thicker layer, followed by removing the remaining photo mask material and etching the exposed thin metal seed layer.

In one embodiment, a semiconductor device package 300 is provided, as shown in FIG. 5. The semiconductor device package 300 includes a laminate 100 comprising a first metal layer 130 disposed on a dielectric film 120. The semiconductor device package 300 includes a plurality of vias 150 extending through the laminate 100 according to a predetermined pattern. One or more semiconductor devices 200 are attached to the dielectric film 120 such that the semiconductor device 200 contacts one or more vias 150. A patterned interconnect layer 192 is disposed on the dielectric film 120, said patterned interconnect layer 192 comprising one or more patterned regions of the first metal layer 130 and an electrically conductive layer 180, wherein a portion of the patterned interconnect layer 192 extends through one or more vias 150 to form an electrical contact with the semiconductor device 200. The patterned interconnect layer 192 further includes a top interconnect region 194 and a via interconnect region 196, wherein the package interconnect region 194 has a thickness greater than a thickness of the via interconnect region 196.

In the embodiments described herein above, the laminate includes a metal layer disposed only on one side of the dielectric film. In another embodiment, the method includes providing a laminate 100 comprising a dielectric film 110 interposed between a first metal layer 130 and a second metal layer 110, as show in FIG. 6. The laminate 100 further includes a first metal layer outer surface 132 and a second metal layer outer surface 112. The first metal layer further includes a first metal layer inner surface 131 disposed adjacent to the dielectric film inner surface 121. The second metal layer 110 further includes a second metal layer inner surface 111 disposed adjacent to the dielectric film outer surface 122. In one embodiment, the second metal layer 110 includes copper.

As noted earlier, the laminate does not include a frame and accordingly the method does not involve the step of framing the dielectric film. In some embodiments, the first metal layer 130 and the second metal layer 110 together provide the structural support for the dielectric film 120 and dimensional stability to the semiconductor device package manufactured therefrom. Further, the first metal layer 130 and the second metal layer 110 may provide for ease of handling and ease of transport in the absence of a carrier frame that is typically used for power overlay fabrication process.

Figure 7:
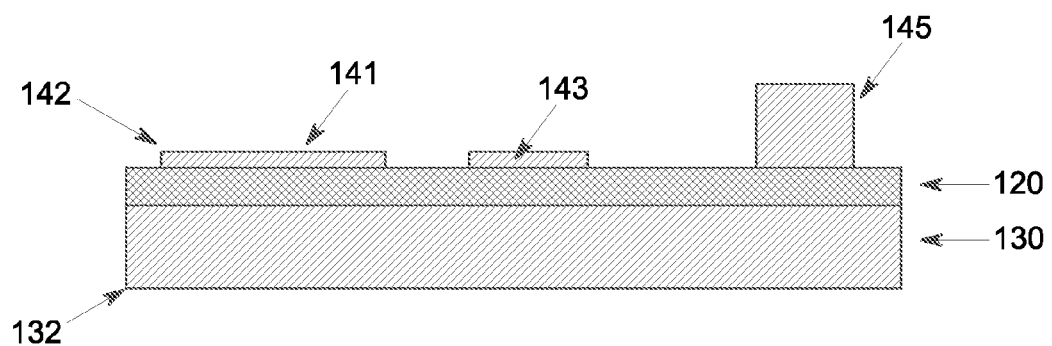
FIG. 7 is a sectional side view of a fabrication process step according to one embodiment of the invention.

In one embodiment, the method further includes patterning the second metal layer 110 according to a predetermined pattern to form a patterned second metal layer 140 as shown in FIG. 7. In some embodiments, the second metal layer 110 is patterned by subtractive etching method or lithography, such as for example, adaptive lithography. In one embodiment, the second metal layer 110 is patterned to form a plurality of patterned second metal layer regions, such as, for example, patterned second metal layer regions 141, 143, and 145 on the dielectric film 120. In one embodiment, the second metal layer 110 is patterned to form one or more feed through structures 145. In some embodiments, the one or more feed through structures 145 may allow for an electrical contact with the drain terminal contact 230 disposed on the opposite surface 204 of the device 200, thus bringing all the electrical connections to the top of the semiconductor device package. In a typical power overlay fabrication process, feed through structures are separately manufactured and subsequently attached to the dielectric film 120, which may increase the number of manufacturing steps and also the associated cost. Further, separately attached feed-through structures may have lower adhesion and increased possibility of defects at the interface between the feed-through structure and the dielectric film. In some embodiments, methods of the present invention advantageously provide for an integrated process for fabrication of feed-through structures using the second metal layer 110, which may result in reduction in number of manufacturing steps and may be economically advantageous.

The size and thickness of the patterned regions 141, 143, and 145 may depend in part on the device thickness, thickness of the feed-through structure desired, and the via pattern. In one embodiment, the second metal layer 110 is further patterned to form one or more patterned regions 141 and 143 having a thickness determined by the thickness of the device to be attached to the dielectric film 120. In such instances, the thickness of the patterned second metal layer regions 141 and 143, for example, may be selectively adjusted such that the attached device 200 is substantially planar with the feed through structure 145 that may facilitate subsequent attachment of a planar substrate.

Figure 8:
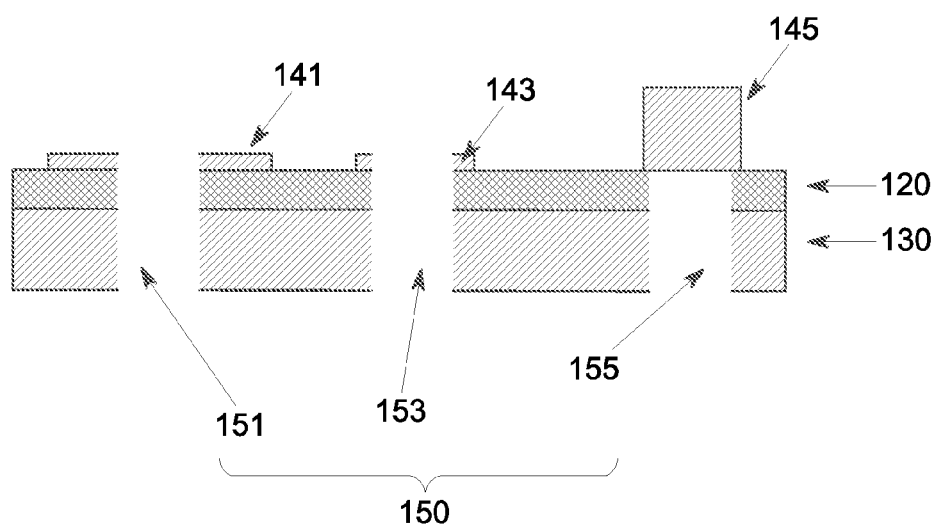
FIG. 8 is a sectional side view of a fabrication process step according to one embodiment of the invention.

The method further includes forming a plurality of vias 150 extending through the laminate according to a predetermined pattern. As shown in FIG. 8, the plurality of vias 150 so formed extend through the first metal layer 130, the dielectric film 120, and a portion of the patterned second metal layer 140. As illustrated in FIG. 8, the plurality of vias 151, 153, and 155 extend through the second metal layer patterned regions 141 and 143, and not through the feed through structure 145. The plurality of vias 150 may be formed by any suitable methods as described earlier. In some embodiments, the plurality of vias may be selectively formed through the laminate, such that, only a portion of the patterned second metal layer 140 is removed to form the vias. For example, as shown in FIG. 8, the illustrative via 155 is formed through the laminate 100 such that the via 155 is aligned with the one or more feed through structure 145 and does not extend through the feed through structure 145. In some embodiments, the plurality of vias are formed after patterning of the second metal layer 110. In an alternative embodiment, the plurality of vias are formed prior to patterning of the second metal layer 110.

Figure 9:
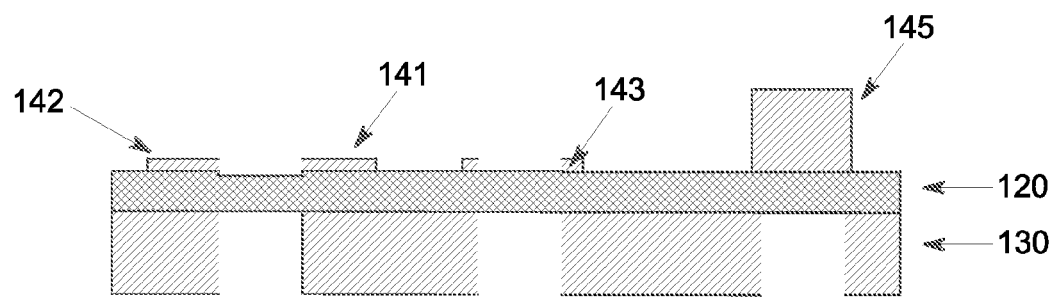
FIG. 9 is a sectional side view of a fabrication process step according to one embodiment of the invention.

In some other embodiments, the second metal layer 110 is selectively patterned before formation of the vias 150 to selectively remove portions of the patterned second metal layer regions, for example, patterned regions 141 and 143, based on the predetermined pattern of the vias 151 and 153, for example. As illustrated in FIG. 9, the second metal layer 110 is patterned to form the patterned second metal layer 140, wherein the patterned metal layer 140 further includes patterned regions 141 and 143, such that a portion of the patterned regions is removed based on the via pattern. In some embodiments, the first metal layer 130 is further selectively patterned before formation of the vias 150 to selectively remove portions of the first metal layer 130, based on the predetermined pattern of the vias 151 and 153, for example, as shown in FIG. 9. In such embodiments, the formation of vias 150 only includes removal of selected portions of the dielectric film 120 to form vias 150 that extend through the laminate, as shown in FIG. 8.

In one embodiment, one or more of the second metal layer patterned region 145 are not in contact with a via 150 and the interconnect layer 192. In such embodiments, during via formation, the via 155, for example may not be present and the second metal layer patterned region 145 may provide a mechanical support to the dielectric film and may function as a frame in the absence of the carrier-frame.

Figure 10:
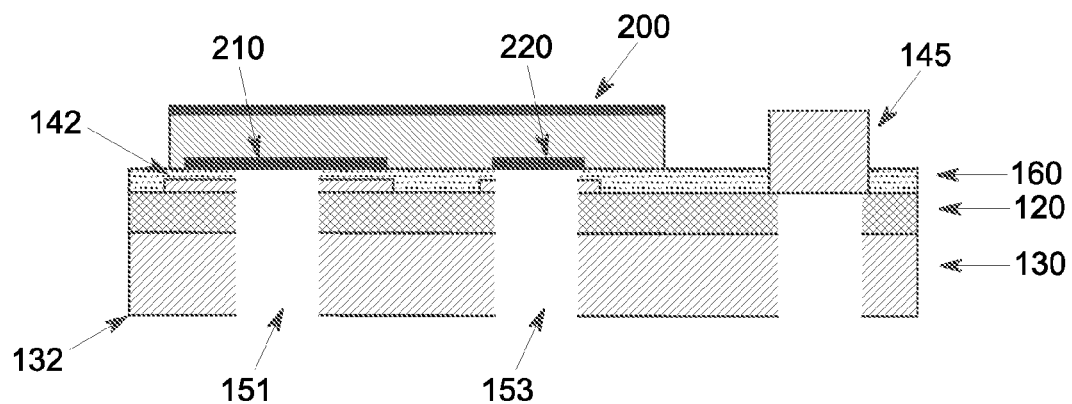
FIG. 10 is a sectional side view of a fabrication process step according to one embodiment of the invention.

The method further includes attaching one or more semiconductor devices 200 to the second metal layer outer surface 142 of a portion of the patterned second metal layer 140. As illustrated in FIG. 10, the device 200 is attached to the second metal layer outer surface 142 of the patterned second metal layer regions 141 and 143. In some embodiments, the method may further include interposing an adhesive layer 160 between the device 200 and the second metal layer outer surface 142 before attaching the device. The adhesive layer 160 may be disposed by a method as described earlier. In one embodiment, after disposing the adhesion layer 160, active major surface 202 of device 200 is brought into contact with adhesion layer 160 so that vias 151 and 153 are aligned with contact pads 210 and 220, as shown in FIG. 10. As noted above, the patterned second metal layer regions 141 and 143 allow for device alignment such that the opposite surface 204 of the device 200 is aligned with the outer surface of the feed through structure 145 to form a substantially planar surface.

Figure 11:
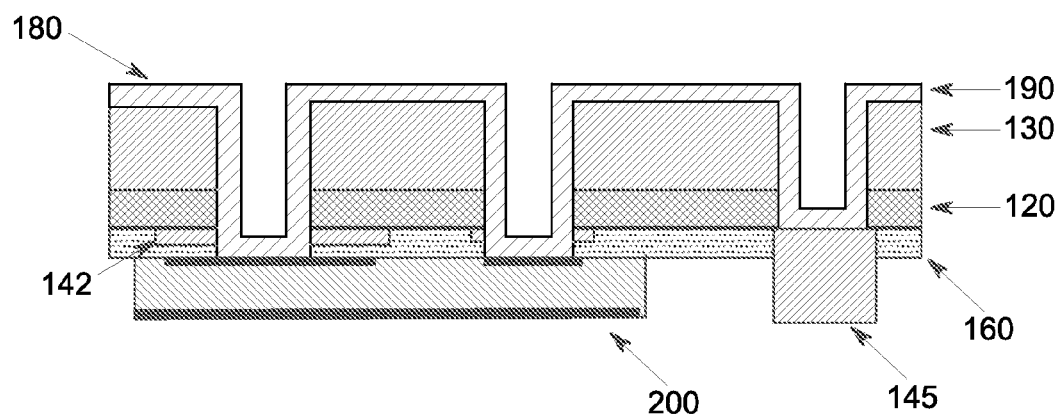
FIG. 11 is a sectional side view of a fabrication process step according to one embodiment of the invention.

In one embodiment, the method further includes disposing an electrically conductive layer 180 on the first metal layer outer surface 132 as shown in FIG. 11. The method further includes disposing the electrically conductive layer 180 on an inner surface 152 of the plurality of vias 150. As illustrated in FIG. 11, the electrically conductive layer 180 and the first metal layer 130 form the interconnect layer 190 on the dielectric film 120. The interconnect layer 190 further extends through the vias as shown in FIG. 11, wherein the interconnect layer 190 comprises of the electrically conductive layer 180 in the vias 150.

Figure 12:
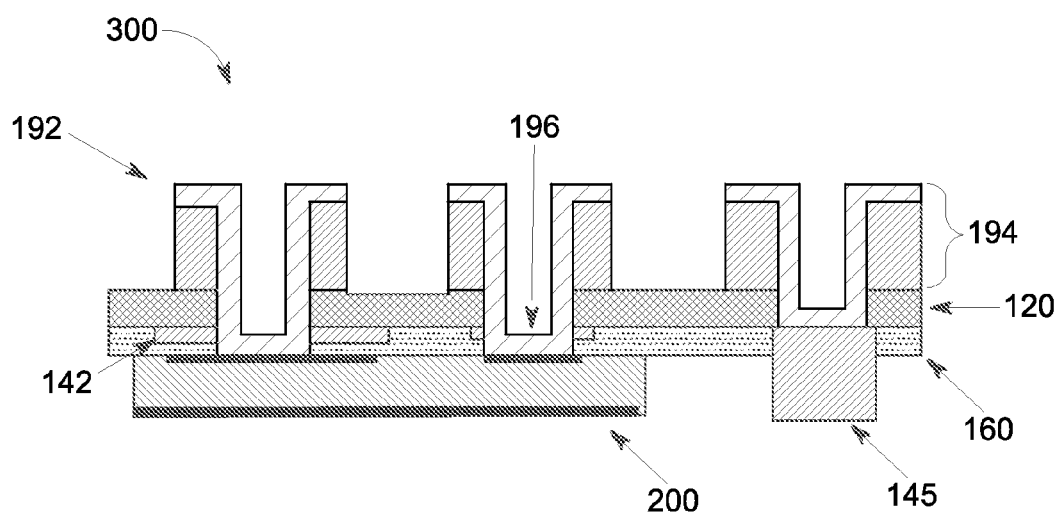
FIG. 12 is a sectional side view of a fabrication process step according to one embodiment of the invention.

The method further includes patterning the interconnect layer 190 according to a predetermined circuit configuration to form a patterned interconnect layer 192, wherein a portion of the patterned interconnect layer 192 extends through one or more vias 150 to form an electrical contact with the semiconductor device 200, as illustrated in FIG. 12. FIG. 12 illustrates a cross-sectional view of device 200 attached to dielectric film 120 after interconnect layer 190 is patterned. Interconnect layer 190 is patterned by selectively removing portions of the interconnect layer 190 to form patterned interconnect layer 192 comprised of packaging structure interconnects. As shown in FIG. 12, the patterned interconnect layer 192 includes a top interconnect region 194 and a via interconnect region 196. The top interconnect region 194 includes patterned portions of the first electrically conductive layer 180 and the first metal layer 130, and is formed adjacent to the dielectric film. The patterned interconnect layer 192 further includes a via interconnect region 196 formed in the plurality of vias 150. A first portion of the via interconnect region 196 is disposed adjacent to the sidewalls of the vias 150 and a second portion is disposed adjacent to one or more contact pads 210/220 of the semiconductor device 200. The via interconnect region 196 comprises of the electrically conductive layer 180. Further, in one embodiment, a portion of the patterned interconnect layer 192 extends through one or more vias 150 to form an electrical contact with the one or more feed-through structures 145, as illustrated in FIG. 12.

Figure 13:
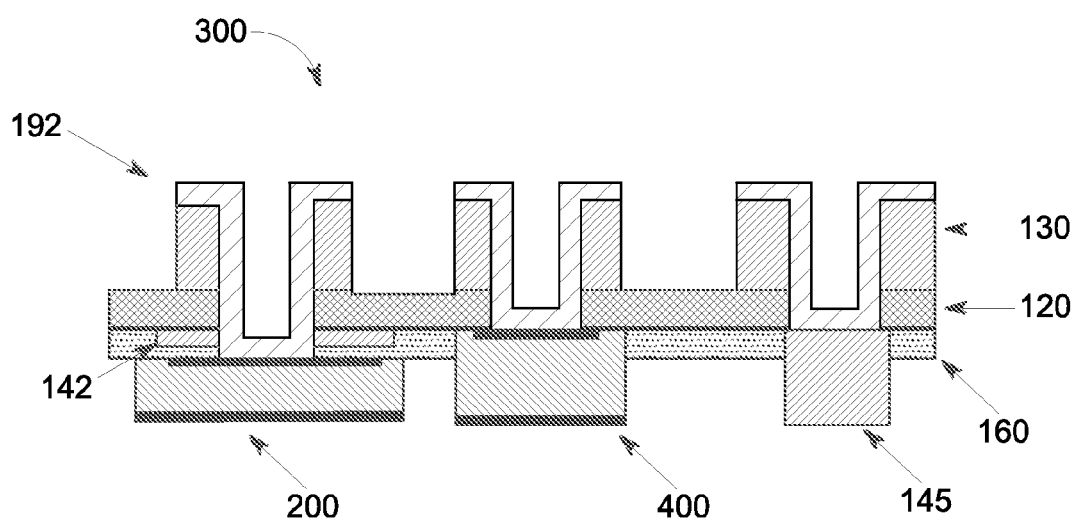
FIG. 13 is a sectional side view of a fabrication process step according to one embodiment of the invention.

In one embodiment, the method further includes patterning the second metal layer 110 before attaching the one or more devices to form a plurality of patterned regions, wherein at least two patterned regions have a thickness different from each other. In such embodiments, the patterned regions of different thickness may advantageously accommodate semiconductor devices having different thicknesses, such that the opposite surface of the semiconductor devices are all aligned and provide a substantially planar surface for attachment of a substrate. In one embodiment, the method further includes attaching a plurality of semiconductor devices to the patterned second metal layer, wherein at least two semiconductor devices have a thickness different from each other. As illustrated in FIG. 13, semiconductor devices 200 and 400 having different thicknesses are advantageously attached to the dielectric film such that the opposite surface of the semiconductor devices are aligned with each other and the outer surface of the feed-through structure. In FIG. 13, only one contact pad is shown aligned with the vias 150, however the semiconductor devices 200 and 400 may include a plurality of contact pads aligned with the vias 150, as described hereinabove.

In one embodiment, a semiconductor device package 300 is provided, as illustrated in FIG. 12. The semiconductor device package 300 includes a laminate 100 comprising a first metal layer 130 disposed on a dielectric film 120. The semiconductor device package 300 further includes a patterned second metal layer 140 disposed on the dielectric film 120 on a side opposite to the first metal layer 130. The patterned second metal layer 140 includes patterned second metal layer regions, such as, for example 141 and 143 and one or more feed-through structures 145. The semiconductor device package 300 includes a plurality of vias 150 extending through the laminate 100 according to a predetermined pattern. One or more semiconductor devices 200 are attached to the second metal layer outer surface 142 of a portion of the patterned second metal layer 140, such that the semiconductor device 200 contacts one or more vias 150. A patterned interconnect layer 192 is disposed on the dielectric film 120, said patterned interconnect layer 192 comprising the first metal layer 130 and an electrically conductive layer 180, wherein a portion of the patterned interconnect layer 192 extends through one or more vias 150 to form an electrical contact with the semiconductor device 200. The patterned interconnect layer 192 includes a top interconnect region 194 and a via interconnect region 196, wherein the package interconnect region 194 has a thickness greater than a thickness of the via interconnect region 196. Further, a portion of the patterned interconnect layer 192 extends through one or more vias 150 to form an electrical contact with the one or more feed-through structures 145.

In one embodiment, the semiconductor device package 300 may be further attached to a semiconductor device substrate (not shown). Semiconductor device substrate may include an insulating substrate having one or more electrically conductive substrate contacts to which semiconductor device 200 may be electrically coupled. For example, semiconductor device 200 may be soldered to substrate contact. Semiconductor device substrate may also include a backside conductive layer, which may facilitate attachment of the semiconductor device 200 to a heat sink, for example.

In some embodiments, the resultant semiconductor device package 300 provides high current-carrying capability, and a low impedance thermal path for conducting heat away from active surface 202 of the semiconductor device. In some embodiments, heat sink structures, electrical interconnect structures, or both, may be mounted to package top, bottom, or both.

The appended claims are intended to claim the invention as broadly as it has been conceived and the examples herein presented are illustrative of selected embodiments from a manifold of all possible embodiments. Accordingly, it is the Applicants' intention that the appended claims are not to be limited by the choice of examples utilized to illustrate features of the present invention. As used in the claims, the word "comprises" and its grammatical variants logically also subtend and include phrases of varying and differing extent such as for example, but not limited thereto, "consisting essentially of" and "consisting of." Where necessary, ranges have been supplied; those ranges are inclusive of all sub-ranges there between. It is to be expected that variations in these ranges will suggest themselves to a practitioner having ordinary skill in the art and where not already dedicated to the public, those variations should where possible be construed to be covered by the appended claims. It is also anticipated that advances in science and technology will make equivalents and substitutions possible that are not now contemplated by reason of the imprecision of language and these variations should also be construed where possible to be covered by the appended claims.

The invention claimed is:

1. A semiconductor device package, comprising:
   a laminate comprising a first metal layer disposed on a dielectric film;
   a plurality of vias extending through the laminate according to a predetermined pattern;
   one or more semiconductor devices attached to the dielectric film such that the semiconductor device contacts one or more vias; and
   a patterned interconnect layer disposed on the dielectric film, said patterned interconnect layer comprising one or more patterned regions of the first metal layer and an electrically conductive layer, wherein a portion of the patterned interconnect layer extends through one or more vias to form an electrical contact with the semiconductor device, and
   the patterned interconnect layer comprises a top interconnect region and a via interconnect region, wherein the top interconnect region has a thickness greater than a thickness of the via interconnect region.

2. The semiconductor device package of claim 1, wherein the laminate further comprises a patterned second metal layer disposed on the dielectric film on a side opposite to the first metal layer.

3. The semiconductor device package of claim 2, wherein the one or more semiconductor devices are attached to the second metal layer outer surface of a portion of the patterned second metal layer.

4. The semiconductor device package of claim 2, wherein the patterned second metal layer further comprises one or more feed-through structures aligned with one or more vias, and a portion of the patterned interconnect layer extends through the one or more vias to form an electrical contact with the one or more feed-through structures.

5. The semiconductor device package of claim 2, wherein the patterned second metal layer further comprises a plurality of patterned regions, wherein at least two patterned regions have a thickness different from each other.

6. The semiconductor device package of claim 5, further comprising a plurality of semiconductor devices attached to the patterned second metal layer, wherein at least two semiconductor devices have a thickness different from each other.

7. The semiconductor device package of claim 1, wherein the via interconnect region has a thickness in a range from about 5 microns to about 125 microns.

8. The semiconductor device package of claim 1, wherein the top interconnect region has a thickness in a range from about 25 microns to about 200 microns.

9. The semiconductor device package of claim 1, wherein the dielectric film comprises a polyimide.

10. The semiconductor device package of claim 1, wherein the first metal layer comprises copper.

11. The semiconductor device package of claim 1, wherein the electrically conductive layer comprises copper.

12. The semiconductor device package of claim 1, wherein the first metal layer has a thickness in a range from about 10 microns to about 200 microns.

13. The semiconductor device package of claim 1, wherein the semiconductor device comprises a semiconductor power device.

14. The semiconductor device package of claim 1, wherein the laminate is frame-less.

* * * * *